United States Patent
Lin

(10) Patent No.: US 10,756,138 B2
(45) Date of Patent: *Aug. 25, 2020

(54) MAGNETIC RANDOM ACCESS MEMORY WITH PERMANENT PHOTO-PATTERNABLE LOW-K DIELECTRIC

(71) Applicant: INTERNATIONAL BUSINESS MACHINES CORPORATION, Armonk, NY (US)

(72) Inventor: Qinghuang Lin, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/671,990

(22) Filed: Nov. 1, 2019

(65) Prior Publication Data

US 2020/0066793 A1    Feb. 27, 2020

Related U.S. Application Data

(63) Continuation of application No. 15/798,816, filed on Oct. 31, 2017, now Pat. No. 10,573,687.

(51) Int. Cl.
*H01L 27/22*    (2006.01)
*H01L 43/02*    (2006.01)
(Continued)

(52) U.S. Cl.
CPC .......... *H01L 27/228* (2013.01); *G11C 11/161* (2013.01); *H01L 21/7682* (2013.01);
(Continued)

(58) Field of Classification Search
CPC . H01L 27/228; H01L 43/12; H01L 21/76877; H01L 21/7682; H01L 43/08; H01L 43/02; H01L 21/76802
See application file for complete search history.

(56) References Cited

U.S. PATENT DOCUMENTS

| 6,087,064 A | 7/2000 | Lin et al. |
| 6,806,096 B1 * | 10/2004 | Kim ........................ H01L 43/12 |
| | | 257/E27.005 |

(Continued)

OTHER PUBLICATIONS

Gaidis, M.C. et al., "Two-level BEOL processing for rapid iteration in MRAM development" IBM Journal of Research and Development (Jan. 2006) pp. 41-54, vol. 50, No. 1.
(Continued)

*Primary Examiner* — Victor A Mandala
(74) *Attorney, Agent, or Firm* — Tutunjian & Bitetto, P.C.; Vazken Alexanian

(57) ABSTRACT

A method of forming a device that includes encapsulating a magnetic resistive access memory (MRAM) stack with a first patternable low-k dielectric material that is patterned by an exposure to produce a via pattern that extends to circuitry to logic devices. The via pattern is developed forming a via opening. The method further includes forming a second patternable low-k dielectric material over first patternable low-k dielectric material and filling the via opening. The second patternable low-k dielectric material is patterned by a light exposure to produce a first line pattern to the MRAM stack and a second line pattern to the via opening. The first line pattern and the second line pattern are developed to form trench openings. Thereafter, electrically conductive material is formed in the trench openings and the via opening.

20 Claims, 9 Drawing Sheets

(51) Int. Cl.
*H01L 43/08* (2006.01)
*H01L 21/768* (2006.01)
*G11C 11/16* (2006.01)
*H01L 43/12* (2006.01)

(52) U.S. Cl.
CPC .. *H01L 21/76802* (2013.01); *H01L 21/76877* (2013.01); *H01L 43/02* (2013.01); *H01L 43/08* (2013.01); *H01L 43/12* (2013.01)

(56) References Cited

U.S. PATENT DOCUMENTS

| | | | |
|---|---|---|---|
| 6,849,465 | B2 | 2/2005 | Park et al. |
| 6,946,698 | B1 | 9/2005 | Lin |
| 7,041,748 | B2 | 5/2006 | Lin et al. |
| 7,056,840 | B2 | 6/2006 | Miller et al. |
| 7,144,744 | B2 | 12/2006 | Lien et al. |
| 7,306,853 | B2 | 12/2007 | Lin et al. |
| 8,029,971 | B2 | 10/2011 | Allen et al. |
| 8,202,783 | B2 | 6/2012 | Lin et al. |
| 9,190,260 | B1 | 11/2015 | Zhang et al. |
| 9,397,139 | B1* | 7/2016 | Tan ................ H01L 43/12 |
| 9,647,200 | B1 | 5/2017 | Annunziata et al. |
| 9,705,077 | B2 | 7/2017 | Annunziata et al. |
| 9,847,477 | B2 | 12/2017 | Huang et al. |
| 2008/0286467 | A1 | 11/2008 | Allen et al. |
| 2009/0233226 | A1 | 9/2009 | Allen et al. |
| 2009/0291389 | A1 | 11/2009 | Allen et al. |
| 2010/0289098 | A1* | 11/2010 | Li ................ H01L 43/02 257/421 |
| 2011/0117677 | A1 | 5/2011 | Yuan et al. |
| 2015/0008546 | A1 | 1/2015 | Sung et al. |
| 2015/0262864 | A1* | 9/2015 | Okamoto ........ H01L 21/31116 438/671 |
| 2015/0318333 | A1* | 11/2015 | Narayanan ....... H01L 23/53238 257/4 |
| 2015/0372225 | A1 | 12/2015 | Gaidis et al. |
| 2016/0268499 | A1* | 9/2016 | You ................ H01L 43/12 |
| 2016/0351792 | A1 | 12/2016 | Jiang et al. |
| 2017/0069684 | A1* | 3/2017 | Suh ................ H01L 43/12 |
| 2017/0092693 | A1* | 3/2017 | Tan ................ H01L 27/228 |
| 2018/0040817 | A1* | 2/2018 | Chuang ............ H01L 27/228 |
| 2018/0366640 | A1* | 12/2018 | Clevenger ........ H01L 43/12 |
| 2019/0006416 | A1* | 1/2019 | Lee ................ G11C 11/161 |
| 2019/0013353 | A1* | 1/2019 | Lee ................ H01L 27/222 |
| 2019/0027679 | A1* | 1/2019 | Ouellette ........ H01L 43/10 |

OTHER PUBLICATIONS

List of IBM Patents or Patent Applications Treated as Related dated Nov. 1, 2019, 2 pages.

* cited by examiner

MAGNETIC RANDOM ACCESS MEMORY WITH PERMANENT PHOTO-PATTERNABLE LOW-K DIELECTRIC

BACKGROUND

Technical Field

The present invention generally relates to memory devices and semiconductor devices, and more particularly to integrated memory devices and semiconductor devices together with permanent photo-patternable low-k dielectric materials.

Description of the Related Art

A magnetoresistive random access memory (MRAM) device includes an electrically connected array of magnetoresistive memory elements, referred to as magnetic tunnel junctions (MTJs). A basic structure of a magnetic tunnel junction includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. An MTJ stores information by switching the magnetization state of the magnetic free layer. MRAM devices are typically integrated with logic devices, e.g., field effect transistors (FET) on a same substrate. Simultaneous processing is required to integrate MRAM devices and logic devices together in electrical components.

SUMMARY

In accordance with an embodiment of the present invention, a method of forming a device including memory devices and logic devices is provided that includes forming a first patternable low-k dielectric material encapsulating a magnetoresistive random access memory (MRAM) stack in a first region of a substrate; and patterning the first patternable low-k dielectric material with a first light exposure to produce a via pattern in a second region of the substrate to circuitry to logic devices in a second region of the substrate. The via pattern is developed to form a via opening. A second patternable low-k dielectric material is formed over the first patternable low-k dielectric material and formed filling the via opening. The second patternable low-k dielectric material is patterned with a second light exposure to produce a first line pattern to connect to the MRAM stack and a second line pattern to the via opening that connects the logic element. Developing the first line pattern and the second line pattern forms trench openings to each of the via opening and the MRAM stack. An electrically conductive material is formed in the trench openings and the via opening that simultaneously electrically connect both the MRAM element and the logic element.

In another embodiment, the method includes forming a device including memory devices and logic devices is provided that includes forming a first patternable low-k dielectric material encapsulating a memory device in a first region of a substrate, in which the memory device includes a magnetic tunnel junction (MTJ) between two electrodes in a first region of a substrate. The method continuous with patterning the first patternable low-k dielectric material with a first light exposure to produce a via pattern in a second region of the substrate to circuitry to logic devices in a second region of the substrate. The via pattern is developed to form a via opening. A second patternable low-k dielectric material is formed over the first patternable low-k dielectric material and formed filling the via opening. The second patternable low-k dielectric material is patterned with a second light exposure to produce a first line pattern to the memory device and a second line pattern to the via opening. Developing the first line pattern and the second line pattern forms trench openings to each of the via opening and the device. An electrically conductive material is formed in the trench openings and the via opening.

In another aspect, a device is provided that includes a memory device and circuitry to logic devices, in which the device includes a permanent photo-patternable low-k dielectric material. In one embodiment, the device includes a substrate having a first region for memory devices and a second region for logic devices. A first level is present atop the substrate, and includes dielectric material housing interconnect circuitry for logic devices. An anti-reflective coating is present on at least the dielectric material of the first level. A second level including a permanent photo-patternable low-k dielectric material is present directly on the anti-reflective coating, in which the permanent photo-patternable low-k dielectric material is encapsulating a memory device including a magnetic tunnel junction (MTJ) between a top electrode and a bottom electrode that is overlying the first region of the substrate. In some embodiments, the permanent photo-patternable low-k dielectric material further contains electrically conductive material in the trench openings that simultaneously electrically connect both the top electrode of the memory device and a metal via extending through the second level to the interconnect circuitry to the logic devices in the first level of the first region of the substrate. In some embodiments, the permanent photo-patternable low-k dielectric material further comprises at least one air gap embedded therein. These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
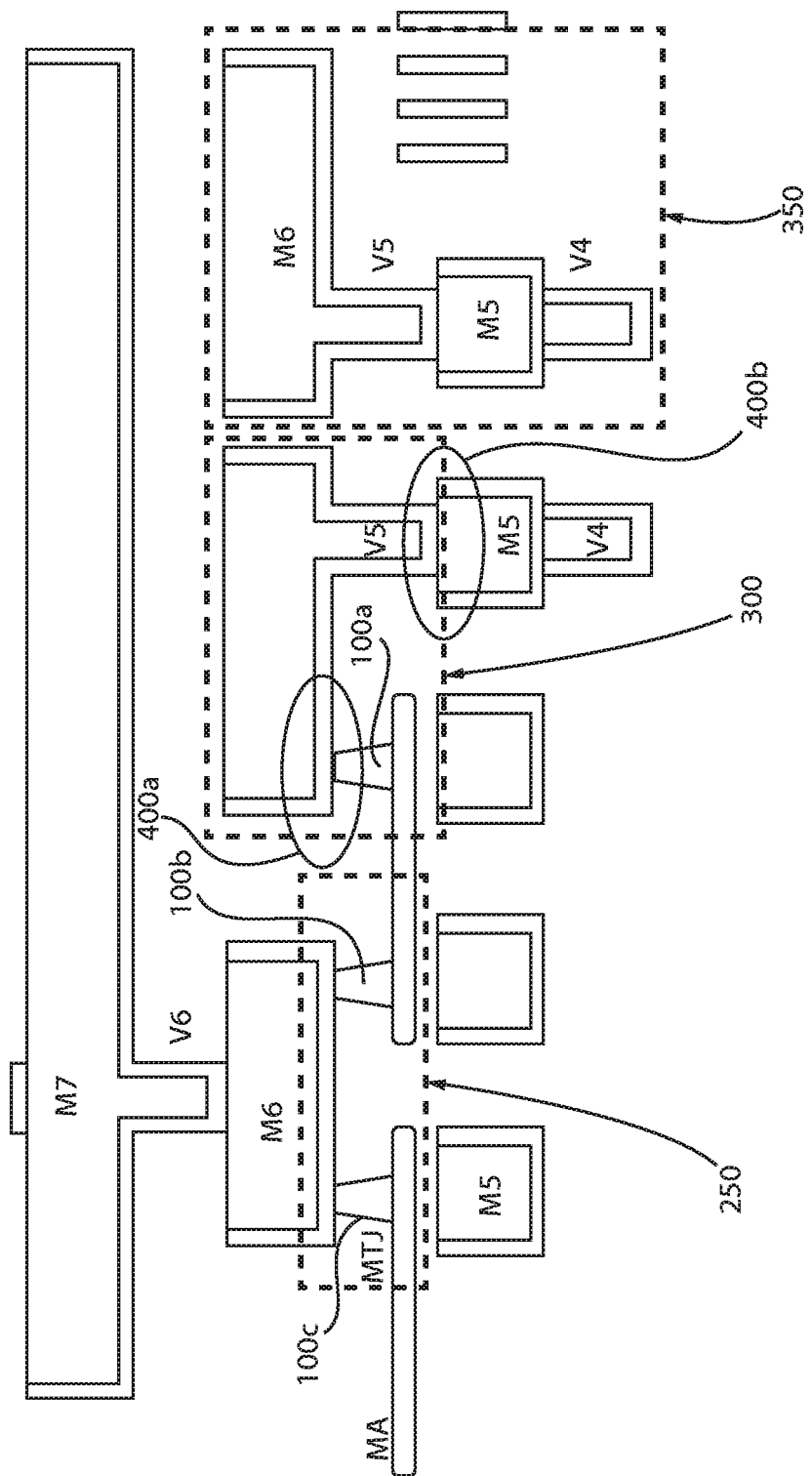
FIG. 1 is a schematic illustrating one embodiment of an MRAM (magnetoresistive random access memory) structure integrated with logic devices following back end of the line processing.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment". "an embodiment". "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper". "lower", "right", "left", "vertical", "horizontal", "top". "bottom", and derivatives thereof shall relate to the invention, as it is oriented in the drawing figures. The terms "overlying", "atop". "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein address the need to form simultaneous contacts to the functional structure of a magnetoresistive random access memory (MRAM) device, and to the logic part of circuit wiring produced during back end of the line manufacturing without damaging the devices with etch process. e.g., over-etching. MRAM (magnetoresistive random access memory) devices store data bits using magnetic states instead of the electrical charges used by dynamic random access memory (DRAM). The logic devices may be any type of device that can switch from an on state to an off state and can submit signal via their switching nature. The logic devices can include field effect transistors (FETs), such as metal oxide semiconductor field effect transistors (MOSFETs), planar semiconductor devices, three dimensional semiconductor devices, Fin type field effect transistors (FinFETs), vertical field effect transistors (VFETs) and other like devices, which may be arranged in complementary metal oxide semiconductor (CMOS) arrangements. Back end of the line (BEOL) processing refers to the processing, in which the individual devices, e.g., logic devices and MRAM devices, get interconnected with wiring on the wafer, i.e., the various metallization layers, which can include metal lines and vias. Metal lines typically travel within the same plane of a level, whereas vias are vertically orientated and provide for connectivity between the different levels of the device. Common metals used for the metal lines and vias may include copper interconnect and aluminum interconnect. The metal lines and vias of provided by the various metallization BEOL includes contacts, insulating layers (dielectrics), metal levels, and bonding sites for chip-to-package connections. The insulating layers, through which the metal lines and vias are formed, can also encapsulate the logic devices and the magnetoresistive random access memory. The insulating layers may be referred to as interlevel dielectric layers and intralevel dielectric layers.

The aforementioned over-etching that can damage the logic devices and/or MRAM (magnetoresistive random access memory) devices can be the etch processes that form the various trenches and vias for the interconnection metallization, which are typically done using a dual damascene process. Etching is used in microfabrication to chemically remove layers from the surface of a wafer during manufacturing. Dry etching refers to the removal of material, typically a masked pattern of semiconductor material, by exposing the material to a bombardment of ions (usually a plasma of reactive gases such as fluorocarbons, oxygen, chlorine, boron trichloride; sometimes with addition of nitrogen, argon, helium and other gases) that dislodge portions of the material from the exposed surface. One form of dry etching is reactive-ion etching. Another form of etching is wet etching. Wet-chemical etching is a technique that utilizes liquid chemicals to remove material. For example, buffered hydrofluoric acid (BHF) is used commonly to etch silicon dioxide over a silicon substrate.

Applicants have determined that a dual damascene process that includes at least two etch processes to define the conductive passageways, i.e., vias and metal lines, interaction with the functional devices. FIG. 1 is a schematic illustrating one embodiment of an MRAM (magnetoresistive random access memory) structure integrated with logic devices following back end of the line processing.

FIG. 1 is a schematic illustrating one embodiment of an MRAM (magnetoresistive random access memory) structure integrated with logic devices following back end of the line processing. In the embodiment that is depicted in FIG. 1, the magnetoresistive random access memory (MRAM) devices are identified by reference numbers 100a, 100b. 100c; and the connection to the logic devices, i.e., logic connection, is identified by reference number 200. Still referring to FIG. 1, the metal lines are identified by M7, M6 and M5; and the vias are identified by V6, V5 and V4. The entirety of the structure depicted in FIG. 1 is encapsulated in dielectric layers, e.g., interlevel and intralevel dielectric layers. The region of the structure designated by the box having the broken line identified by reference number 250 is a region including magnetically active structures for magnetoresistive random access memory (MRAM) devices. The region of the structure designated by the box having the broken line identified by reference number 350 includes the wiring, i.e., metal lines and vias, provided by back end of the line (BEOL) processing to the logic devices. The region of the structure designated by the box having the broken line identified by reference number 300 is the region of the device including the magnetoresistive random access memory (MRAM) and logic connection. This region is present between the region 250 including magnetically active structures for magnetoresistive random access memory (MRAM) devices; and the region 350 including the wiring, i.e., metal lines and vias, provided by back end of the line (BEOL) processing to the logic devices. The contacts identified by reference numbers 400a, 400b are contacts, which have been determined to be susceptible to etch erosion that results from the multiple, e.g., two, etch process treatments of a dual damascene process sequence that can result in over-etching. The contact 400a may be a contact between a metal line M6 and the magnetoresistive random access memory (MRAM) device 100a that is present in the region of the device 300 including the magnetoresistive random access memory (MRAM) and logic connection. The contact 400b may be a contact between a the via V5 and the underlying metal line M5 that provides the wiring for the logic connection that is present in the region of the device identified by reference number 300.

It has been determined that the discovered over-etching of the contacts 400a. 400b can be eliminated by eliminating the etch processes that define these contacts 400a, 400b. In some embodiments, the etch process sequence employed by dual damascene methods that are employed to form the contacts 400a, 400b can be eliminated by employing a spin-on, on-chip permanent patternable low-k dielectric material that is substituted for the dielectric material layers that require patterning using etch processes.

As will be described herein, the spin-on, on-chip permanent patternable low-k dielectric material can be patterned using photolithography and development without using etch processes to define the geometry of the material. A photo-patternable low-K dielectric material combines the functions of a traditional resist and a low-K dielectric material into one single material. It acts as a traditional resist during patterning and is subsequently converted to a low-K dielectric material during a post-patterning curing process. No sacrificial materials (separate resists or hardmasks) and their related film deposition, pattern transfer and removal are required to form dual-damascene BEOL structures. Consequently, this novel photo-patternable low-K material concept offers a highly efficient BEOL integration process, resulting in substantial cost savings and faster turn-around time.

The methods and structures that are described herein can form consistent top contact to the magnetic tunnel junctions (MTJ) and the logic wiring (via the thickness of the first patternable low-k film). The methods and structures provided herein can enhance yield of the manufacturing of magnetoresistive random access memory (MRAM) devices. Additionally, the methods provided herein are a simplified process when compared to dual damascene processes, and the methods provided herein do not include reactive ion etching (RIE). The methods and structures of the present disclosure are now described with reference to FIGS. 2-16.

Figure 2:
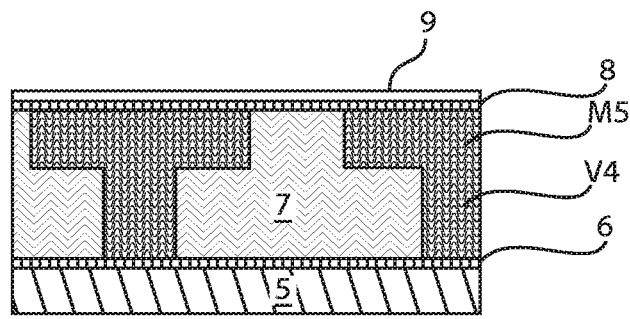
FIG. 2 is a side cross-sectional view depicting one embodiment of an initial structure including a magnetoresistive random access memory (MRAM) device and a logic device on the same substrate for use in a process sequence that does not rely upon etch process to form the contacts to the devices.

FIG. 2 depicts one embodiment of an initial structure including a magnetoresistive random access memory (MRAM) device 100a and a logic device, i.e., circuitry to a logic device being depicted) on the same substrate 5 for use in a process sequence that does not rely upon etch process, such as reactive ion etching, to form the contacts 400a to the magnetoresistive random access memory (MRAM) device 100a, as well as contacts 400b between metal vias and metal lines for circuitry go the logic devices.

In the embodiment depicted in FIG. 2, the substrate 5 may comprise a semiconducting material, an insulating material, a conductive material or any combination thereof (e.g., a lower level of an interconnect structure). When the substrate 5 is comprised of a semiconducting material, any semiconductor such as Si, SiGe, SiGeC, SiC, Ge alloys, GaAs. InAs, InP, other II/V or II/VI compound semiconductors, and organic semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

In some embodiments, an optional first dielectric cap layer 6 is formed on the surface of substrate 5 utilizing a conventional deposition process such as, for example, chemical vapor deposition (CVD), plasma enhanced chemical vapor deposition (PECVD), atomic layer deposition (ALD), spin coating, brush coating, spray coating, dip coating, or evaporation. The first dielectric cap layer 6 comprises any suitable dielectric capping material such as, for example. SiC, SiN, $SiO_2$, a carbon doped oxide, a nitrogen and hydrogen doped silicon carbide SiC(N,H) or multilayers thereof.

Still referring to FIG. 2, at least one dielectric layer 7, e.g., at least one interlevel dielectric layer and/or intralevel dielectric layer, may be present on the optional dielectric cap. In some embodiments, the at least one dielectric layer 7 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer include any of the aforementioned materials in porous form, or in a form that changes during processing to or from being porous and/or permeable to being non-porous and/or non-permeable. It is noted that the at least one dielectric layer 7 that is depicted in FIG. 2 may be substituted with the patternable low-k dielectric material that can be patterned without etch steps, as described below.

FIG. 2 also depicts at least one level of metal lines M5 and vias V4 that are integrated within the at least one dielectric layer 7. Each of the metal lines M5 and vias V4 may be formed using photolithography and etching to form trenches (for the metal lines M5) and via openings (for the vias V4) followed by filling the trenches with an electrically conductive material, such as a metal or metal containing material, e.g., copper (Cu), aluminum (Al), tungsten (W), tungsten nitride (WN), titanium (Ti), titanium nitride (TiN), and combinations thereof. Deposition process for forming the metal lines an vias can include physical vapor deposition (PVD). e.g., sputtering; plating, e.g., electroplating and/or electroless plating; chemical vapor deposition (CVD); and other type deposition processes. Following deposition of the metal, a planarization process, such as chemical mechanical planarization (CMP) may be applied to provide that the upper surfaces of the dielectric layer 7 and the metal lines M5 are coplanar.

A material stack of a second dielectric cap layer 8 and an anti-reflective coating layer 9 if present atop the coplanar upper surfaces of the dielectric layer 5 and the metal lines M5. The second dielectric cap layer 8 is similar to the first dielectric cap layer 6. Therefore, the above description of the first dielectric cap layer 6 provides one example of the composition and method of forming the second dielectric cap layer 8. In some embodiments, the second dielectric cap layer 8 may be omitted.

The anti-reflective coating layer 9 can be formed on a surface of the second dielectric cap 8 if present, or directly on a surface of the substrate 5 when the second dielectric cap 8 is not present. In some embodiments, the ARC layer 9 employed has the following general characteristics: (i) it acts as an ARC during a lithographic patterning process; (ii) It withstands high-temperature BEOL integration processing (up to 500° C.); (iii) It prevents photoresist, e.g., photo-patternable low-k (PPLK) material, poisoning by the substrate; (iv) It provides vertical wall profile and sufficient etch selectivity between the photoresist, e.g., PPLK material, and the ARC layer, (v) It serves as a permanent dielectric layer in the device (low dielectric constant, preferably k<5, more preferably k<3.6); and (vi) It is compatible with conventional BEOL integration and produces reliable hardware.

In some embodiments, the anti-reflective coating layer 9 has a thickness from 1 nm to 200 nm, with a thickness from 10 nm to 140 nm being more typical. The anti-reflective coating layer 9 may be inorganic or a hybrid of inorganic and organic. The anti-reflective coating layer 9 be a single layer or multilayer. It may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as the anti-reflective coating layer 10, and may be deposited, for example, by plasma-enhanced chemical vapor deposition, spin-on techniques, spray coating, dip coating, etc. After applying the anti-reflective coating layer 9, particularly from a liquid phase, a post deposition, a baking step can be employed to remove unwanted components, such as solvent, and to effect crosslinking. The post deposition baking step for the anti-reflective coating layer 10 can be performed at a temperature from 80° C. to 300° C. In another embodiment, the anti-reflective coating layer 10 with a baking temperature from 120° C. to 200° C. being even more typical.

In some embodiments, the as-deposited anti-reflective coating layer 9 may be subjected to a post deposition treatment to improve the properties of the entire layer or the surface of the anti-reflective coating layer 9. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of the anti-reflective coating layer 9 and/or the film stack, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

In one embodiment, the anti-reflective coating layer 9 that is employed is an inorganic composition that includes elements of M, C (carbon) and H (hydrogen), wherein M is selected from at least one of the elements of Si, Ge, B, Sn, Fe, Ta, Ti, Ni, Hf and La. In one embodiment, anti-reflective coating layer 9 is produced by a vapor or liquid phase deposition (such as, for example, CVD. PECVD, PVD, ALD and spin-on coating) method using appropriate precursors or combination of precursors containing elements described above.

In one example, the anti-reflective coating layer 9 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane ($SiH_4$) derivatives having the molecular formula $SiR_4$, cyclic Si containing compounds including cyclocarbosilane where the R substituents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Figure 3:
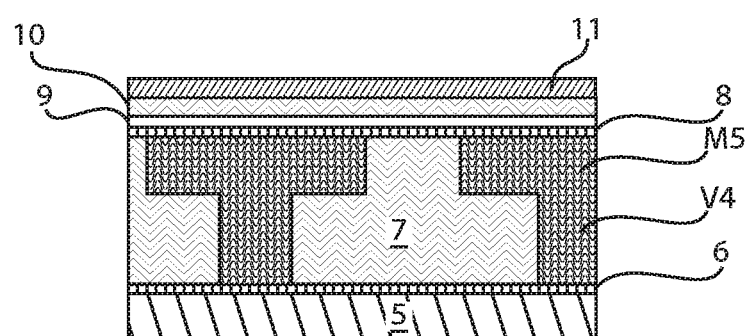
FIG. 3 is a side cross-sectional view depicting forming a dielectric layer for underlying an MRAM device atop a etch stop layer, and forming a lower electrode layer for the MRAM device atop the dielectric layer.

FIG. 3 depicts forming a dielectric layer (hereafter referred to as MRAM supporting dielectric layer 10) for underlying an MRAM device 100a atop the ARC layer 9, and forming a lower electrode layer 11 for the MRAM device 100a atop the MRAM supporting dielectric layer 10. The supporting dielectric layer 10 is similar to the at least one dielectric layer 7, e.g., interlevel and/or intralevel dielectric layers, that have been described above with reference to FIG. 2. Therefore, the above description of the at least one dielectric layer 7 provides one example of the composition and method of forming the supporting dielectric layer 10. In some embodiments, the supporting dielectric layer 10 may be a silicon containing dielectric layer blanket deposited above an entire upper surface of the anti-reflective coating layer 9.

The lower electrode layer 11 may then be blanket deposited atop an entire upper surface of the supporting dielectric layer 10. The metal layer that is deposited for the lower electrode layer 11 can be considered part of a metallization layer of the BEOL structure. The lower electrode 11 provides a contact and pedestal on which to build the magnetic tunnel junction pillar 12 . . . . The lower electrode 11 can be formed of any suitable conductive material(s), such as tungsten, copper, aluminum, platinum, silver, gold, tantalum, tantalum nitride, ruthenium, titanium, and combinations thereof. The metal layer for the lower electrode 11 can be formed by physical vapor deposition, e.g., sputtering; plating, e.g., electroplating or electroless plating; by chemical vapor deposition. e.g., metal organic chemical vapor deposition (MOCVD) and/or plasma enhanced chemical vapor deposition (PECVD); or a combination thereof.

Figure 4:
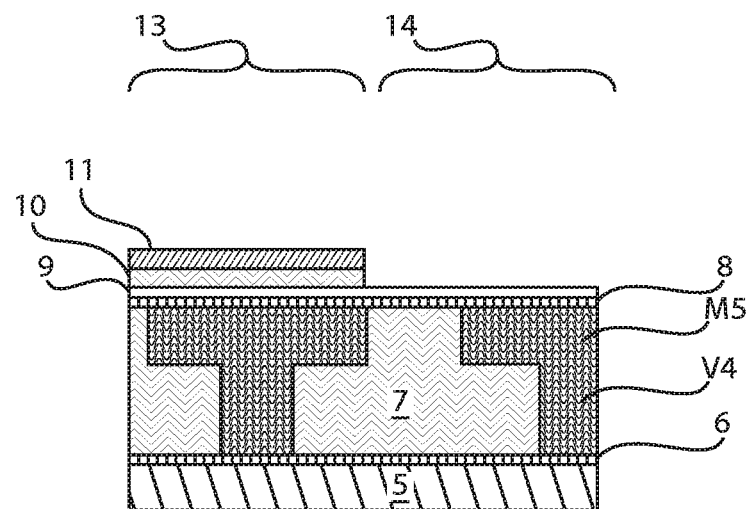
FIG. 4 is a side cross-sectional view depicting patterning the lower electrode layer and the dielectric layer to define the region of the structure in which the MRAM device is to be positioned, and to remove the material layers for the MRAM device from the regions in which the contacts to the logic part of the circuit wiring is to be positioned.

FIG. 4 depicts one embodiment of patterning the lower electrode layer 11 and the supporting dielectric layer 10 to define the region 13 of the structure in which the MRAM device 100a is to be positioned, and to remove the portions of the lower electrode layer 11 and the supporting dielectric layer 10 from the regions 14 in which the contacts to the logic part of the circuit wiring is to be positioned. Patterning at this stage of the process flow may include deposition, photolithograph, development and etching. Specifically, an etch pattern mask is produced by applying a photoresist to the surface to be etched; exposing the photoresist to a pattern of radiation; and then developing the pattern into the photoresist utilizing resist developer. Once the patterning of the photoresist is completed the etch pattern mask is formed, and the sections covered by the photoresist, i.e., etch pattern mask, are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. For example, the exposed portions of the lower electrode layer 11, and the supporting dielectric 10, may be removed by an etch that is selective to at least the etch pattern mask. In some embodiments, the etch may be selective to the ARC layer 9. The etch process for removing the exposed portions of the lower electrode layer 11 and the supporting dielectric layer 10 that is employed at this stage of the process flow may be provided by reactive ion etch (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. It is noted that RIE, as well as other etch processes, may be used at this stage of the process flow, but they are distinguished from photo-patternable low-k (PPLK) material that can be patterned into permanent material layers that remain in the final device structure using only photolithography and development, and not etch processes, as used in the following process steps.

Figure 5:
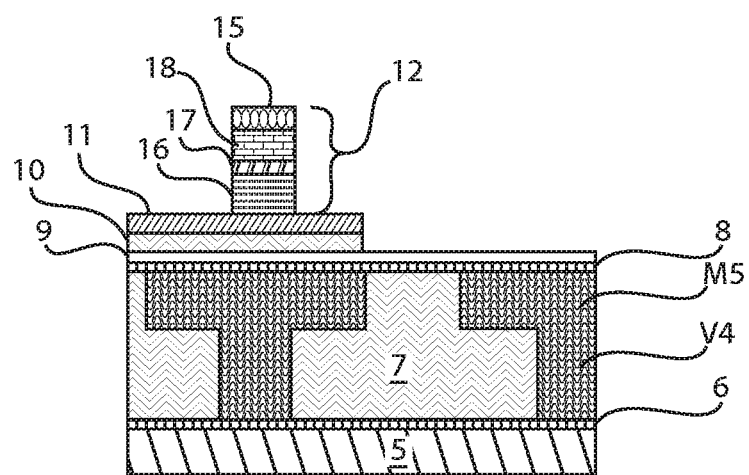
FIG. 5 is side cross-sectional view depicting forming a magnetic tunnel junction (MTJ) stack for the MRAM device atop the lower electrode layer that is depicted in FIG. 4.

FIG. 5 depicts one embodiment of forming a magnetic tunnel junction (MTJ) stack 12 for the MRAM device 100a atop the lower electrode layer 11 that is depicted in FIG. 4. FIG. 5 also depicts forming a second electrode atop the MTJ stack 12. The MTJ 12 and second electrode 15 are formed at some level in the BEOL structure by sequentially depositing layers of materials forming the magnetic pinned layer 16, the tunnel barrier layer 17, and free magnetic layer 18 for the MTJ stack 12, which is followed by a material layer for the second electrode 15. The aforementioned deposition steps can be followed by patterning the deposited layers to form the second electrode 150 and the MTJ stack 12 shown in FIG. 5.

In one embodiment, the magnetic pinned layer 16 may be formed by depositing a layer of magnetic material which includes cobalt (Co) or iron (Fe), boron (B), or any combination thereof. In one example, the magnetic pinned layer 16 can be formed of CoFeB or CoFe. The tunnel barrier layer 17 is formed of a non-magnetic, insulating material such as magnesium oxide (MgO), aluminum oxide ($Al_2O_3$), or titanium oxide ($TiO_2$) or any other suitable materials. The free magnetic layer 18 can be formed of a magnetic material such as iron (Fe) or a magnetic material including at least one of cobalt (Co) or iron (Fe) or nickel (Ni), or any combination thereof. The second electrode 15 can be formed of any suitable conductive material(s) such as tantalum, tantalum nitride, ruthenium, titanium, etc. Each of the aforementioned layers may be formed by one of chemical vapor deposition (CVD), e.g., plasma enhanced chemical vapor deposition (PECVD) and/or metal organic chemical vapor deposition (MOCVD); atomic layer deposition (ALD); physical vapor deposition (PVD), e.g., sputtering; plating, e.g., electroplating and/or electroless plating; and combinations thereof.

The stack structure shown in FIG. 5 including the upper electrode 15 and the MTJ stack 12 is formed by patterning the conductive material layer (e.g., TaN) to form the upper electrode 15 using photolithography and etching, which serves as a hard mask to etch the layers of materials forming the MTJ stack 12. The conductive material layer (forming the upper electrode 15) can be etched selective to the underlying magnetic material using a reactive ion etch (RIE) process, such as a halogen-based chemical etch process (e.g., including chlorine-containing gas and/or fluorine-containing gas chemistry). The hard mask (e.g., upper electrode 15) is then used as an etch mask to etch the underlying magnetic and tunnel barrier layers 16, 17, 18, wherein the pattern of the hard mask is transferred to the underlying magnetic free layer 18, the tunnel barrier layer 17, and the pinned (reference) layer 16 using a standard MRAM stack etch process, e.g., a reactive ion etching (RIE) or an ion beam etch (IBE) process).

It is to be understood that the MTJ stack 12 depicted in FIG. 5 is merely one embodiment of a MTJ stack 12, which can implemented to provide a single magnetic tunnel junction stack framework. The term "MTJ stack" as used herein is meant to broadly refer to any stack structure which includes, at the very least, an MTJ stack 12 which includes two magnetic layers (e.g., ferromagnetic and/or ferrimagnetic layers) and an insulating layer deposited between the two magnetic layers through which electrons can tunnel. In some other embodiments, the MTJ 12 may include other magnetic, conductive and/or insulting layers, depending on the given application. For example, additional stacked layers may include two or more magnetic layers and two or more tunnel barrier layers, and other layers that are commonly implemented to construct other types of magnetic tunnel junction structures, e.g., double magnetic tunnel junction structures.

Figure 6:
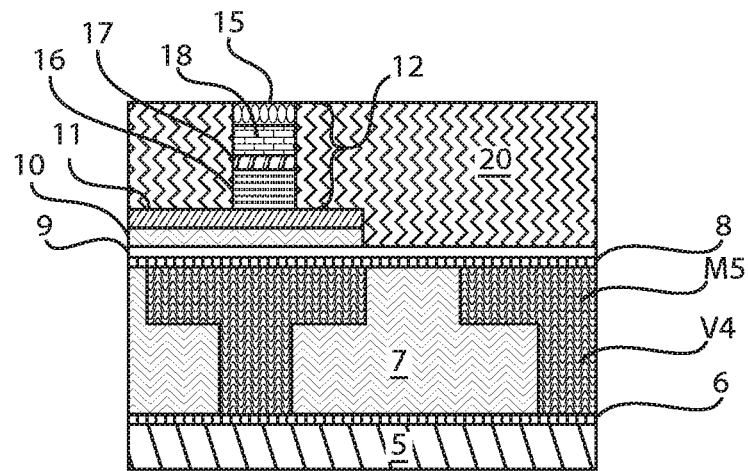
FIG. 6 is a side cross-sectional view depicting one embodiment of forming a first layer of a patternable low-k silsesquioxane based material that encapsulates the metallization on the logic side of the device, and encapsulates a majority of the magnetic tunnel junction (MTJ) stack for the MRAM device.

FIG. 6 depict one embodiment of forming a first layer of a patternable low-k silsesquioxane based material 20 (also referred to as photo-patternable low-k (PPLK) material), that encapsulates the metallization on the logic side 14 of the device, and encapsulates a majority of the magnetic tunnel junction (MTJ) stack 12 for the MRAM region 13 of the device. The term "photo-patternable low k material (or PPLK for short)" includes a functionalized polymer, copolymer or blend including at least two of any combination of polymers and/or copolymers having one or more acid-sensitive imagable groups. The PPLK material acts as a photoresist and after curing it is converted into a dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described below.

In some embodiments, the PPLK material of the first layer of the patternable low-k silsesquioxane based material 20 is a patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, oxycarbosilane substituted oxycarbosilane and combinations thereof.

In one example, the PPLK material that can be employed is a patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane, carbosilane substituted silsesquioxane, carbosilane substituted siloxane, carbosilane substituted silane, carbosilane substituted carbosilane, carbosilane substituted oxycarbosilane, oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally, the PPLK material may be patternable composition further comprising at least one microscopic pore generator (porogen). The pore generator may be or may not be photo/acid sensitive.

Illustrative polymers for the PPLK material for the first layer of the patternable low-k silsesquioxane based material 20 include, but are not limited to siloxane, silane, carbosilane, oxycarbosilane, silsesquioxane-type polymers including caged, linear, branched or combinations thereof. In one embodiment, the PPLK material is a patternable composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009 all of which are incorporated herein by reference in their entirety.

The PPLK material is formed from a patternable composition (negative-tone or positive-tone) that includes at least one of the above mentioned polymers, copolymers or blends, a photoacid generator, a base additive and a solvent typically used in a photoresist composition. When the PPLK material is a negative-tone patternable material, it may be formed from a patternable composition optionally including an additional cross-linker. By "negative-tone" it is meant that the part of the PPLK material that is exposed to photolithography will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone patternable material, it is formed from a patternable composition that includes at least one of the above mentioned polymers, copolymers or blends, a photoacid generator, a base additive and a solvent typically used in photoresists. By 'positive-tone" it is meant that the part of the PPLK material that is exposed to photolithography will be removed by a conventional developer, while the unexposed part of the PPLK material is not removed. The photoacid generators, base additives and solvents are well known to those skilled in the art and, as such, details regarding those components are not fully provided.

Referring to FIG. 6, the first layer of the patternable low-k silsesquioxane based material 20 may be blanket deposited atop the structure depicted in FIG. 5. The PPLK material for the first layer of the patternable low-k silsesquioxane based material 20 can be formed utilizing a deposition process including, for example, spin-on-coating, dip coating, brush coating, blade coating, chemical solution deposition, and ink-jet dispensing. In some embodiments, after applying the PPLK material, a post deposition baking step is applied, but not necessarily always, employed to remove unwanted components, such as solvent. When performed, the baking step can be conducted at a temperature from 40° C. to 200° C. In some embodiments, the baking temperature may range from 60° C. to 140° C. The duration of the baking step can range from 10 seconds to 600 seconds. The applied PPLK material for the first layer of the patternable low-k silsesquioxane based material 20 may have a thickness ranging from 1 nm to 50000 nm. In one embodiment, the PPLK material for the first layer of the patternable low-k silsesquioxane based material 20 may have a thickness ranging from 20 nm to 5000 nm.

Figure 7:
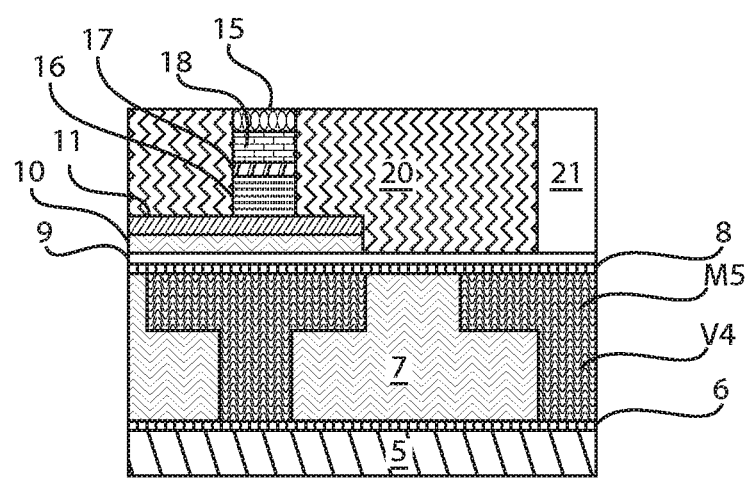
FIG. 7 is a side cross-sectional view depicting one embodiment of patterning and developing the first layer of a patternable low-k silsesquioxane based material to form a via opening to the logic part of the circuit wiring.

FIG. 7 depicts one embodiment of patterning and developing the first layer of a patternable low-k silsesquioxane based material 20 to form a via opening 21 to the logic part of the circuit wiring. More specifically, the via opening 21 extends to a metal line M5 of the logic part of the circuit wiring. As noted above, the PPLK material of the first layer of the patternable low-k silsesquioxane based material 20 can be patterned, i.e., have its geometry changed by removing a portion of the PPLK material, using only photolithography and chemical development. Photolithography, also termed optical lithography or UV lithography, is a process used in microfabrication to pattern parts of a thin film or the bulk of a substrate. Photolithography employs light to transfer a geometric pattern from a photomask to the PPLK material that provides the first layer of a patternable low-k silsesquioxane based material 20 to form a via opening 21. Depending upon whether the PPLK material functions as a positive or negative resist, the portion of the PPLK material that provides the first layer of a patternable low-k silsesquioxane based material 20 to form a via opening 21 is contacted by the light (in the case of a positive resist function) to be removed, or the portion of the PPLK that is contacted by the light (in the case of a negative resist function) remains to provide a dielectric material in the final structure, in which the portions of the PPLK not contacted by the light is removed.

When the PPLK material is functioning as a positive type photoresist is exposed to the UV light, the chemical structure of the PPLK material changes and becomes more soluble in the photoresist developer. These exposed areas of the PPLK material for the first layer of a patternable low-k silsesquioxane based material 20 are then washed away with the developer solvent to form a via opening 21. In this example, the areas of the PPLK material of that are not exposed to the UV light are left insoluble to the photoresist developer.

When the PPLK material is functioning as a negative type photoresist is exposed to UV light, the chemical structure of the PPLK material can be polymerized, which is just the opposite of positive resist type functioning PPLK material. Instead of becoming more soluble, negative PPLK material become extremely difficult to dissolve. As a result, the UV exposed negative PPLK material remains on the surface. In this scenario, the photoresist developer solution works to remove the areas of the PPLK material that provides the first layer of a patternable low-k silsesquioxane based material 20 that are unexposed to produce the via opening 21.

The pattern wise exposing process of the photolithography step can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), or an electron beam. The exposing process may be performed in a dry mode or an immersion mode. The first pattern-wise exposing process also includes direct writing without the use of a mask with, for example, light, electron beam, ion beam, and scanning probe lithography. Other patterning techniques that can be used include contact printing techniques such as nanoimprint lithography, embossing, micro contact printing, replica molding, microtransfer molding, micromolding in capillaries and solvent-assisted micromolding, thermal assisted embossing, inject printing, and the like.

The development step for forming the via opening 21 may include a chemical developer. In some embodiments, the developer for removing the exposed portions of the PPLK material that provides the first layer of a patternable low-k silsesquioxane based material 20 may be an aqueous base solution, such as 0.26N tetramethylammoniahydroxide (TMAH) solution.

In the embodiment depicted in FIG. 7, the via opening 21 is formed without etch processes, such as reactive ion etch (RIE). The via openings 21 depicted in FIG. 7 are formed using solely photolithography light exposure and chemical development.

Figure 8:
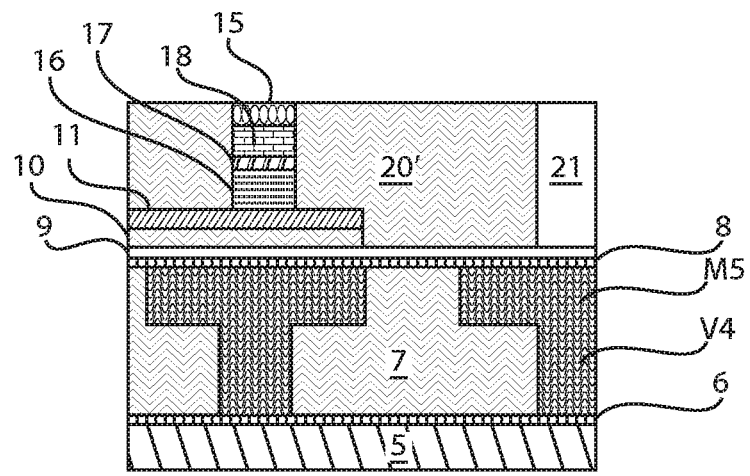
FIG. 8 is a side cross-sectional view depicting one embodiment of curing the patternable low-k silsesquioxane based material to convert the material to a patterned first dielectric device layer.

FIG. 8 depicts one embodiment of curing the patternable low-k silsesquioxane based material 20 to convert the material to a patterned first dielectric device layer 20'. The PPLK material for the first layer of a patternable low-k silsesquioxane based material 20 possesses two functions. They act as a photoresist during a patterning process and are subsequently converted into a low-k dielectric insulator during a post patterning cure process. The cured product of a patternable low-k material, therefore, can serve as an on-chip dielectric insulator. The terms "cure" or "curing" are used interchangeable to refer one of the processes selected from a thermal cure, an electron beam cure, an ultra-violet (UV) cure, an ion beam cure, a plasma cure, a microwave cure or a combination thereof. A "cured" product of a patternable low-k material is the product of the patternable low-k material after it has undergone one of the aforementioned cure processes. The "cured" product of a patternable low-k material is different from the patternable low-k material in chemical nature and physical, mechanical and electrical properties. In some embodiments, the cured product of processed PPLK material has a dielectric constant of 4.3 or less. In other embodiments, the cured product of processed PPLK material has a dielectric constant of less than 3.8.

In some embodiments, curing is performed by a thermal cure, an electron beam cure, an ultra-violet (UV) cure, an ion beam cure, a plasma cure, a microwave cure or a combination thereof. In one example, the cure process is provided using an irradiation cure step that is performed by a combination of a thermal cure and an ultra-violet (UV) cure, wherein the wavelength of the ultra-violet (UV) light is from 50 to 300 nm and the light source for the ultra-violet (UV) cure is a UV lamp, an excimer (exciplex) laser or a combination thereof. The excimer laser may be generated from at least one of the excimers selected from the group consisting of $Ar_2$, $Kr_2$, $F_2$, $Xe_2$, ArF, KrF, XeBr, XeCl, XeCl, XeF, $CaF_2$, KrCl, and $Cl_2$ wherein the wavelength of the excimer laser is in the range from 50 to 300 nm. Additionally, the light of the ultra-violet (UV) cure may be enhanced and/or diffused with a lens or other optical diffusing device known to those skilled in the art In another embodiment, the curing step is a combined UV/thermal cure. This combined UV/thermal cure is carried out in a UV/thermal cure module under vacuum or inert atmosphere, such as $N_2$, He, Ar or a combination thereof. In one embodiment, the UV/thermal cure temperature is from 100° C. to 500° C. In another embodiment, the UV/thermal cure temperature is from 300° C. to 450° C. The duration of the UV/thermal cure can range from 0.5 minutes to 30 minutes. In some embodiments, the duration of the UV/thermal cure can range from 1 minute to 10 minutes. The UV cure module is designed to have a very low oxygen content to avoid degradation of the resultant dielectric materials. In some embodiments, the cure step depicted in FIG. 8 may be omitted.

Figure 9:
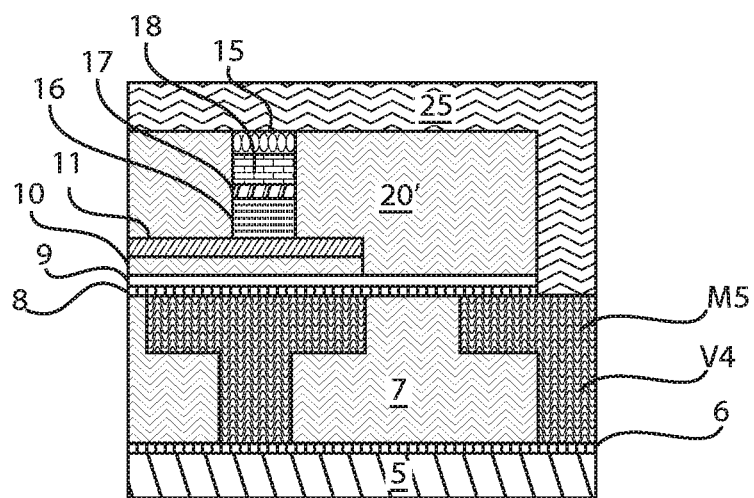
FIG. 9 is a side cross-sectional view depicting one embodiment of depositing a second layer of a patternable low-k silsesquioxane based material that fills the via opening and is present atop the first layer of the patternable first dielectric device layer of the low-k silsesquioxane based material.

FIG. 9 depicts one embodiment of depositing a second layer of a patternable low-k silsesquioxane based material 25 that fills the via opening 21, and is present atop the patterned first dielectric device layer 20' of the cured PPLK material. The second layer of the patternable low-k silsesquioxane based material 25 is similar to the PPLK material for the first layer of a patternable low-k silsesquioxane based material 20. Therefore, the above description of the PPLK material for the first layer of a patternable low-k silsesquioxane based material 20 that is described with reference to FIGS. 6-8 are suitable for providing the description of at least one embodiment of the second layer of a patternable low-k silsesquioxane based material 25.

Figure 10:
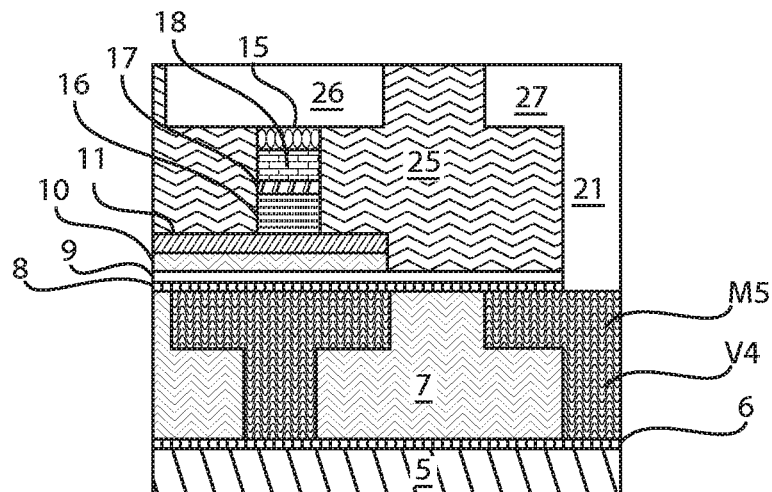
FIG. 10 is a side cross-sectional view depicting patterning and developing the second layer of the patternable low-k silsesquioxane based material to provide a first trench for a first metal line in direct contact with the magnetic tunnel junction (MTJ) stack for the MRAM device, and a second trench for a second metal line in connection with the via opening.

FIG. 10 depicts patterning and developing the second layer of the patternable low-k silsesquioxane based material 25 to provide a first trench 26 for a first metal line in direct contact with the magnetic tunnel junction (MTJ) stack 12 for the MRAM device 100a, and a second trench 27 for a second metal line in connection with the via opening 21. In addition to forming the first and second trenches 26, 27, patterning and developing the second layer of the patternable low-k silsesquioxane based material 25 removes the PPLK material from the via opening 21 to the logic wiring.

The geometry provided by patterning and developing the second layer of the patternable low-k silsesquioxane based material 25 is similar to the geometry that is provided by a dual damascene structure. The depth of the first trench 25 for the first metal line that is in direct contact with the upper electrode 15 of the MTJ stack 12 is substantially the same as the depth of the second trench 27 for a second metal line to the via opening 21.

The pattern and developing process steps applied to the PPLK material of the second layer of the patternable low-k silsesquioxane based material 25 are similar to the pattern and development steps for patterning the first layer of the patternable low-k silsesquioxane based material 20. Therefore, the above description of patterning and developing the PPLK material for first layer of the patternable low-k silsesquioxane based material 20 is suitable for describing at least one embodiment of patterning and developing the second layer of the patternable low-k silsesquioxane based material 25. For example, the first and second trenches 26, 27 may be formed using only photolithography based light exposure and chemical development without employing etching processes, such as reactive ion etching (RIE). Similarly, the portion of the second layer of the patternable low-k silsesquioxane based material 25 that is present in the via opening 21 is removed using photolithography and chemical development processes without employing etching processes, such as reactive ion etching (RIE).

Figure 11:
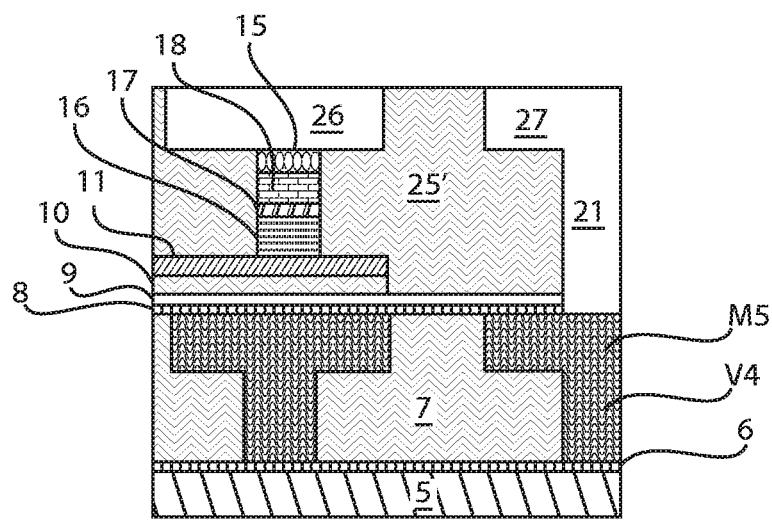
FIG. 11 is a side cross-sectional view depicting one embodiment of curing the second layer of the patternable low-k silsesquioxane based material to convert the material to a patterned second dielectric device layer.

FIG. 11 depicts one embodiment of curing the second layer of the patternable low-k silsesquioxane based material 25 to convert the PPLK material to a patterned second dielectric device layer 25'. The PPLK material for the second layer of a patternable low-k silsesquioxane based material 25 possesses two functions. They act as a photoresist during a patterning process and are subsequently converted into a low-k dielectric insulator during a post patterning cure process. The cured product of a patternable low-k material, therefore, can serve as an on-chip dielectric insulator. The curing step depicted in FIG. 11 is similar to the curing step that has been described above with reference to FIG. 8.

Figure 12:
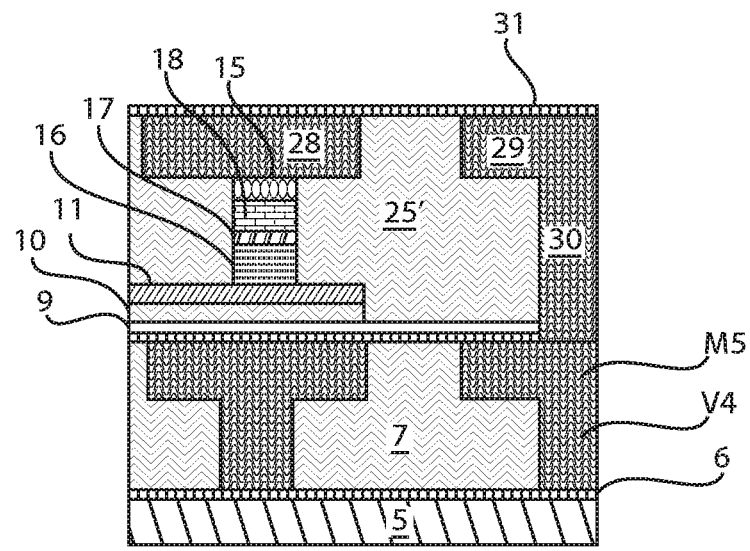
FIG. 12 is a side cross-sectional view depicting one embodiment of filling the metal lines and vias depicted in FIG. 11 with an electrically conductive material.

FIG. 12 depicts one embodiment of filling the trenches 26, 27 for the metal lines and via openings 21 depicted in FIG. 11 with an electrically conductive material. The metal lines 28, 29 deposited within the trenches 26, 27, and the metal via 30 formed in the via opening 21 can be formed of any suitable conductive material(s), such as tungsten, copper, aluminum, platinum, silver, gold, tantalum, tantalum nitride, ruthenium, titanium, and combinations thereof. The metal materials for the metal lines 28, 29 and the metal via 30 can be formed by physical vapor deposition, e.g., sputtering; plating, e.g., electroplating or electroless plating; by chemical vapor deposition, e.g., metal organic chemical vapor deposition (MOCVD) and/or plasma enhanced chemical vapor deposition (PECVD); or a combination thereof. Following deposition of the metal, the upper surface of the structure may be planarized using chemical mechanical planarization (CMP).

FIG. 12 also depicts forming a third dielectric cap 31 atop the planar upper surface of the metal lines 28, 29 and the patterned second dielectric device layer 25' of the PPLK material. The third dielectric cap layer 31 is similar to the first dielectric cap layer 6. Therefore, the above description of the first dielectric cap layer 6 provides one example of the composition and method of forming the third dielectric cap 31.

The contacts illustrated by reference numbers 400A and 400B in FIG. 12 are not subjected to etch processing, such as reactive ion etching (RIE). The contacts identified by reference numbers 400A and 400b illustrate applicability of the method described with reference to FIGS. 2-12 to the structure depicted in FIG. 1.

Figure 15:
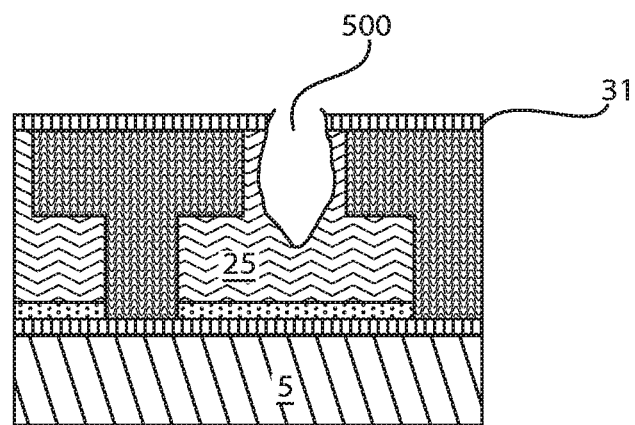
FIG. 15 is a side cross-sectional view depicting applying a developer to the air gap pattern forming an air gap opening.
Figure 16:
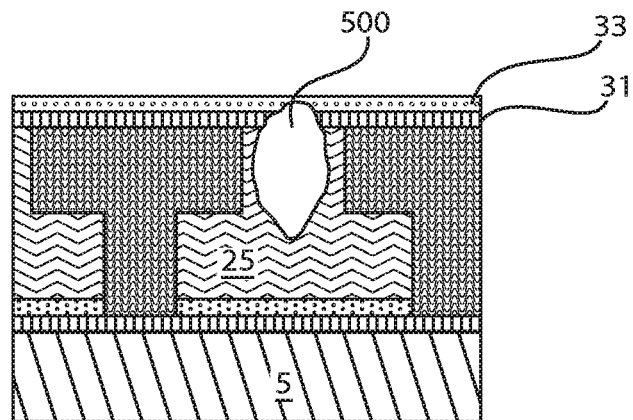
FIG. 16 is a side cross-sectional view depicting forming a dielectric cap atop the air gap opening at a first line level, wherein the air gap opening pinches off the air gap, in accordance with one embodiment of the present invention.
Figure 17:
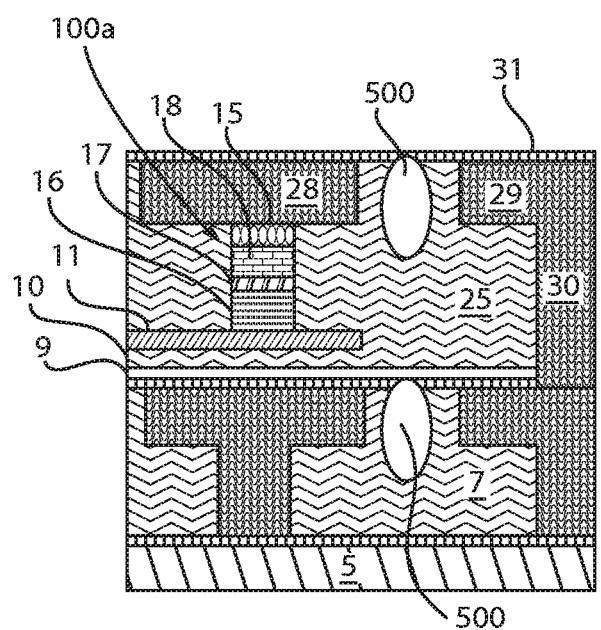
FIG. 17 is a side cross-sectional view depicting forming air caps at a first line level and a second line level, in which the second line level includes the memory device.

In some embodiments, the method and structures described with reference to FIGS. 1-12 may be further processed to provide air gaps 500. One process flow for forming air gaps 500 in the structure depicted in FIG. 12 is now described with reference to FIGS. 13-17. FIGS. 13-16 depict forming the air gaps 500 in a first line level. FIG. 17 depicts the air gaps 500 being formed in a second line level.

Figure 13:
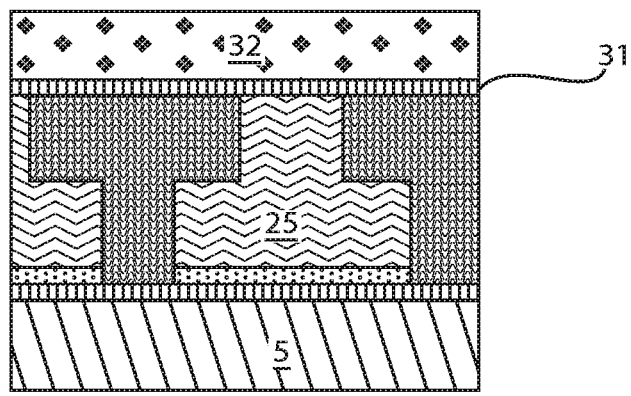
FIG. 13 is a side cross-sectional view depicting one embodiment of forming a material layer for a photoresist mask employed for forming air gaps in the structure depicted in FIG. 12.
Figure 14:
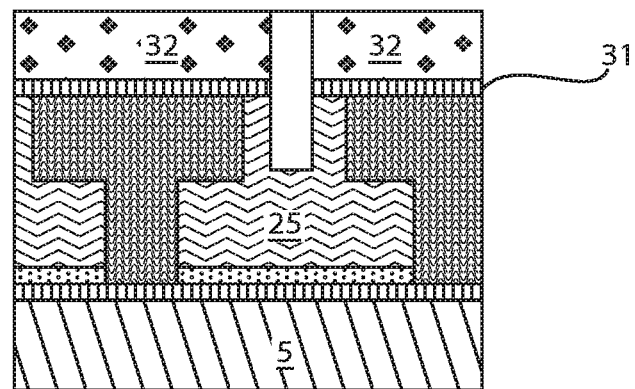
FIG. 14 is a side cross-sectional view depicting forming an air gap pattern into the patterned second dielectric device layer composed of the low-k silsesquioxane based material.

In some embodiments, to provide the air gaps 500, a photolithography step is employed after the interconnect structure build up, i.e., the formation of the metal lines 28, 29, to define the air gap position in-between the metal lines. Referring to FIG. 13, the structure identified by reference number 32 may be the material layer for forming a photoresist mask, which may be referred to as a cap and block level deposition. FIG. 14 patterning an air gap into the patterned second dielectric device layer 25' composed of the low-k silsesquioxane based material, i.e., PPLK material. Patterning at this stage may be a UV light exposure consistent with photolithography. Following patterning, the photoresist mask may be removed. Since the metal lines are not sensitive to ultra violet radiation, the lithography requirements in terms of the dimension and alignment are relaxed. Referring to FIG. 15, the PPLK material exposed in the lithography step can then be removed by a chemical developer leaving gaps in-between the metal lines, i.e., metal lines 28, 29 and vias 31. After forming the gaps, the remaining PPLK material is cured forming a cured and patterned permanent low k dielectric including gaps in-between the metal lines. When forming air gaps 500, the curing step described above with reference to FIG. 11 may be omitted. Referring to FIG. 16, a dielectric cap 33 is then formed atop the cured and permanent low k dielectric material 25' sealing off the gaps, i.e., air gaps 500, forming an air gap-containing interconnect structure in which the air gaps are formed within the cured and patterned permanent low k dielectric material in-between the metal lines, i.e., metal lines 28, 29 and vias 31. FIG. 17 depicts the air gaps 500 being formed in a second line level including the memory device 100*a*.

Having described preferred embodiments of a magnetic random access memory with permanent photo-patternable low-k dielectric, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a device including memory devices and logic devices comprising:
   forming a first patternable low-k dielectric material encapsulating a magnetic resistive access memory (MRAM) stack in a first region of a substrate;
   patterning the first patternable low-k dielectric material to produce a via pattern in a second region of the substrate and form a via opening;
   forming a second patternable low-k dielectric material over the first patternable low-k dielectric material and filling the via opening to produce a first line pattern to the MRAM stack and a second line pattern to the via opening;
   developing the first line pattern and the second line pattern to form trench openings to each of the via opening and the MRAM stack; and
   electrically connecting the MRAM memory stack with logic devices formed in the second region of the substrate.

2. The method of claim 1, wherein the via pattern and the trench openings are formed without etch processes.

3. The method of claim 1, wherein at least one of the first patternable low-k dielectric material and the second patternable low-k dielectric material comprises a functionalized polymer, copolymer or blend including at least two of any combination of polymers and/or copolymers having one or more acid-sensitive imagable groups.

4. The method of claim 1, wherein magnetoresistive random access memory (MRAM) stack comprises a magnetic tunnel junction (MTJ) including a magnetic pinned layer, a tunnel barrier layer, and a free magnetic layer.

5. The method of claim 4, magnetoresistive random access memory (MRAM) stack further includes an upper electrode and a lower electrode on opposing sides of the MJT.

6. The method of claim 1, wherein at least one of the first and second patternable low-k dielectric material are processes by applying a mask, and a photolithography process selected from the group consisting of light photolithography, electron beam photolithography, ion beam photolithography, scanning probe lithography and combinations thereof.

7. The method of claim 1, further comprising a curing step applied to at least one of the first and second patternable low-k dielectric materials.

8. The method of claim 1, wherein electrically connecting includes employing electrically conductive material selected from the group consisting of tungsten (W), titanium (Ti), titanium nitride (TiN), tantalum (Ta), tantalum nitride (TaN), copper (Cu), gold (Au), silver (Ag), aluminum (Al) and combinations thereof.

9. The method of claim 1, wherein the logic devices are selected from the group consisting of field effect transistors (FETs), metal oxide semiconductor field effect transistors (MOSFETs), planar semiconductor devices, three dimensional semiconductor devices, Fin type field effect transistors (FinFETs), vertical field effect transistors (VFETs) and combinations thereof.

10. The method of claim 1, further comprising forming air gaps in the second patternable low-k dielectric material.

11. The method of claim 10, wherein the forming the air gaps comprises forming an air gap pattern in the second patternable low-k dielectric material and applying a developer to the air gap pattern to form an air gap opening.

12. The method of claim 10, further comprising forming a pinch off dielectric layer over the air gap opening.

13. A method of forming a device including memory devices and logic devices comprising:
   forming a first patternable low-k dielectric material encapsulating at least one memory device comprising a magnetic tunnel junction (MTJ) between two electrodes in a first region of a substrate;
   patterning the first patternable low-k dielectric material to produce a via pattern in a second region of the substrate and form a via opening;
   forming a second patternable low-k dielectric material over the first patternable low-k dielectric material and filling the via opening to produce a first line pattern to the at least one memory device and a second line pattern to the via opening;
   developing the first line pattern and the second line pattern to form trench openings to each of the via opening and the memory device; and
   electrically connecting both the top electrode of the at least one memory device with logic devices formed in the second region of the substrate.

14. The method of claim 13, wherein the MTJ comprises a magnetic tunnel junction (MTJ) including a magnetic pinned layer, a tunnel barrier layer, and a free magnetic layer.

15. The method of claim 13, further comprising forming air gaps in the second patternable low-k dielectric material.

16. The method of claim 15, wherein the forming the air gaps comprises forming an air gap pattern in the second patternable low-k dielectric material and applying a developer to the air gap pattern to form an air gap opening.

17. The method of claim 15, further comprising forming a pinch off dielectric layer over the air gap opening.

18. The method of claim 13, wherein the via pattern and the trench openings are formed without etch processes.

19. The method of claim 13, wherein at least one of the first patternable low-k dielectric material and the second patternable low-k dielectric material comprises a functionalized polymer, copolymer or blend including at least two of any combination of polymers and/or copolymers having one or more acid-sensitive imagable groups.

20. The method of claim 13, further comprising a curing step applied to at least one of the first and second patternable low-k dielectric materials.

\* \* \* \* \*